United States Patent [19]
Hoshi

[11] Patent Number: 5,029,137
[45] Date of Patent: Jul. 2, 1991

[54] SEMICONDUCTOR MEMORY DEVICE WITH TANDEM SENSE AMPLIFIER UNITS

[75] Inventor: Katsuji Hoshi, Tokyo, Japan
[73] Assignee: NEC Corporation, Tokyo, Japan
[21] Appl. No.: 441,662
[22] Filed: Nov. 27, 1989
[30] Foreign Application Priority Data
  Nov. 28, 1988 [JP] Japan .................. 63-299968
[51] Int. Cl.$^5$ .............................. G11C 11/40
[52] U.S. Cl. ..................... 365/208; 365/190; 365/203
[58] Field of Search ............... 365/149, 203, 205, 207, 365/208, 190

[56] References Cited
U.S. PATENT DOCUMENTS
  4,112,512 9/1978 Arzubi et al. .................. 365/149 X
  4,542,483 9/1985 Procyk .................. 365/205 X Primary Examiner—Joseph A. Popek
Attorney, Agent, or Firm—Sughrue, Mion, Zinn, Macpeak & Seas

[57] ABSTRACT

A semiconductor memory device is used for storing data bits in memory cells thereof, and the data bits are read out from the memory cells in the form of small differences in voltage level on bit line pairs coupled to the memory cells, wherein gate transistors are inserted between each of the bit line pairs and a pair of sense nodes, and in which the bit line pair and the sense node pair are respectively associated with first and second sense amplifier circuits for rapidly increasing the small difference in voltage level, because the electric charges accumulated in the bit line pair are shared by the first and second sense amplifier circuits.

3 Claims, 4 Drawing Sheets

SEMICONDUCTOR MEMORY DEVICE WITH TANDEM SENSE AMPLIFIER UNITS

FIELD OF THE INVENTION

This invention relates to a semiconductor memory device and, more particularly, to tandem sense amplifier units associated with bit line pairs, respectively.

DESCRIPTION OF THE RELATED ART

A typical example of the semiconductor memory device is illustrated in FIG. 1 of the drawings. Memory cells M11, M12, M21 and M22 are of the random access type, and are arranged in rows and columns. A plurality of bit lines BA1, BA2, BB1 and BB2 are associated with the memory cells M11 to M22, and the bit lines BA1 and BA2 are paired with the bit lines BB1 and BB2 for forming bit line pairs. The bit lines BA1, BA2, BB1 and BB2 are respectively coupled between the columns of the memory cells and the ground node GND, and word lines W1 and W2 are respectively coupled to the rows of the memory cells for providing respective conduction paths between the bit lines BA1, BA2, BB1 and BB2 and the memory cells. Each of the memory cells M11 to M22 is used for memorizing a data bit of either high or low voltage level.

The bit line pairs are coupled to a source of positive voltage level Vcc/2 through a precharging circuit 1, and the precharging circuit 1 not only charges but also equalizes the bit lines BA1, BA2, BB1 and BB2. The precharging circuit 1 is responsive to a precharging signal PCH, and all of the bit lines BA1, BA2, BB1 and BB2 are charged to an intermediate voltage level between the high and low voltage level.

The bit line pairs are further coupled to sense amplifier circuits SA1 and SA2, respectively, and the sense amplifier circuits SA1 and SA2 are coupled between a high voltage signal line SP and a low voltage signal line SN. All of the sense amplifier circuits are identical in circuit arrangement with one another, so that only the sense amplifier circuit SA1 is described hereinbelow. The sense amplifier circuit SA1 comprises two series combinations of n-channel type field effect transistors TN1 and TN2 and p-channel type field effect transistors TP1 and TP2. The gate electrodes of one series combination are coupled to the bit line BB1, but the gate electrodes of the other series combination are coupled to the other bit line BA1.

Between the bit line pairs and data lines DLA and DLB are provided a plurality of gate transistor pairs GT1 and GT2 which are gated by a column selecting signal consisting of bits CL1 and CL2. The gate selecting signal allows one of the gate transistor pairs to turn on for conducting one of the bit line pairs to the data lines DLA and DLB. C10 indicates a parasitic capacitance between the bit lines BA1 and BB1, and the parasitic capacitance between the bit line BB1 and BA2 is represented by C11.

The behavior of the prior art semiconductor memory device is illustrated in FIG. 2 of the drawings. Assuming now that the memory cell M21 is accessed from the outside of the semiconductor memory device and that the memory cell M21 memorizes the data bit of logic "1" corresponding to the high voltage level, the precharging signal PCH goes up to the high voltage level for charging up all of the bit lines BA1, BA2, BB1 and BB2 to the intermediate voltage level. If the precharging signal PCH is recovered from the high voltage level to the low voltage level at time t11, all of the bit lines BA1, BA2,BB1 and BB2 are isolated from the source of positive voltage level Vcc/2. If the word line WL2 goes up to the high voltage level at time t12, the memory cell M21 allows the bit line BA1 to slightly go up as indicated by dV, but the bit line BB1 remains in the intermediate voltage level.

Subsequently, the high voltage signal line SP goes up from the intermediate voltage level to the high voltage level, and the low voltage signal line SN goes down from the intermediate voltage level to the low voltage level at time t13. The small difference in voltage level dV is increased through the differential amplifying operation in the sense amplifier circuit SA1.

Then, a large difference in voltage level takes place between the bit lines BA1 and BB1, and the column selecting signal CL1 allows the gate transistor pair GT1 to turn on. The large difference in voltage levels is relayed from the bit line pair to the data lines DLA and DLB.

However, a problem is encountered in the prior art semiconductor memory device in operation speed consumed in the reading out operation. This is because of the fact that the sense amplifier circuit SA1 needs to discharge the electric charges accumulated in one of the bit line pair. The prior art semiconductor memory device further has a problem in error due to the parasitic capacitance C11 which is coupled to one of the bit lines.

SUMMARY OF THE INVENTION

It is therefore an important object of the present invention to provide a semiconductor memory device which is improved in operation speed.

It is also an important object of the present invention to provide a semiconductor memory device which is free from the error made in the reading out operation.

To accomplish these objects, the present invention proposes to provide a plurality of tandem sense amplifier units respectively associated with a plurality of bit line pairs for sharing the electric charges accumulated in the bit line pairs, respectively.

In accordance with the present invention, there is provided a semiconductor memory fabricated on a semiconductor substrate, comprising: a) a memory cell array having a plurality of memory cells arranged in rows and columns, the memory cells being used for memorizing data bits, respectively; b) a plurality of first bit lines each coupled o every second column of the memory cells; c) a plurality of second bit lines respectively coupled to the other columns of the memory cells and paired with the first bit lines for forming a plurality of bit line pairs; d) a plurality of row lines respectively coupled to the rows of the memory cells and allowing a part of the data bits to be read out to the first bit lines or the second bit lines in the form of small differences in voltage level between the first and second bit lines, respectively; e) a precharging circuit coupled to the bit line pairs; f) a plurality of sense amplifier units respectively having sense node pairs and espectively provided in association with the bit line pairs for increasing the small differences in voltage level, each of the sense node pair having first and second sense nodes; g) a data input and output unit for communicating with an external device; and h) a column selector circuit coupled to the bit line pairs for interconnecting one of the bit line pairs and the data input and output unit, in which each of the sense amplifier units has a pair of gate transistors respectively inserted between the sense node pair and the associated first and second bit lines, a first sense amplifier circuit coupled to the associated first and second bit lines, and a second sense amplifier circuit coupled to the sense node pair thereof.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENT

Figure 1:
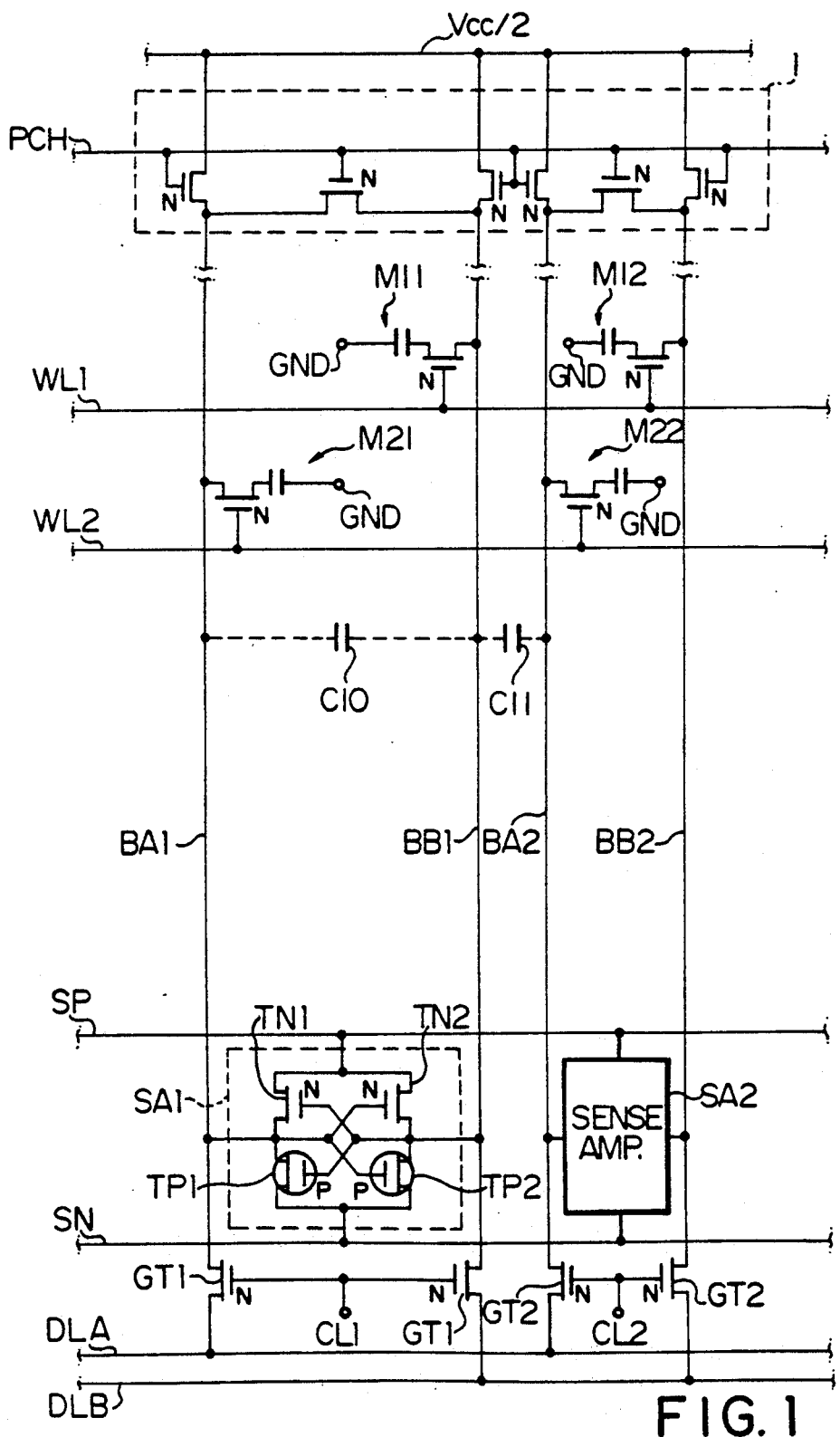
FIG. 1 is a circuit diagram showing the arrangement of the prior art semiconductor memory device.
Figure 2:
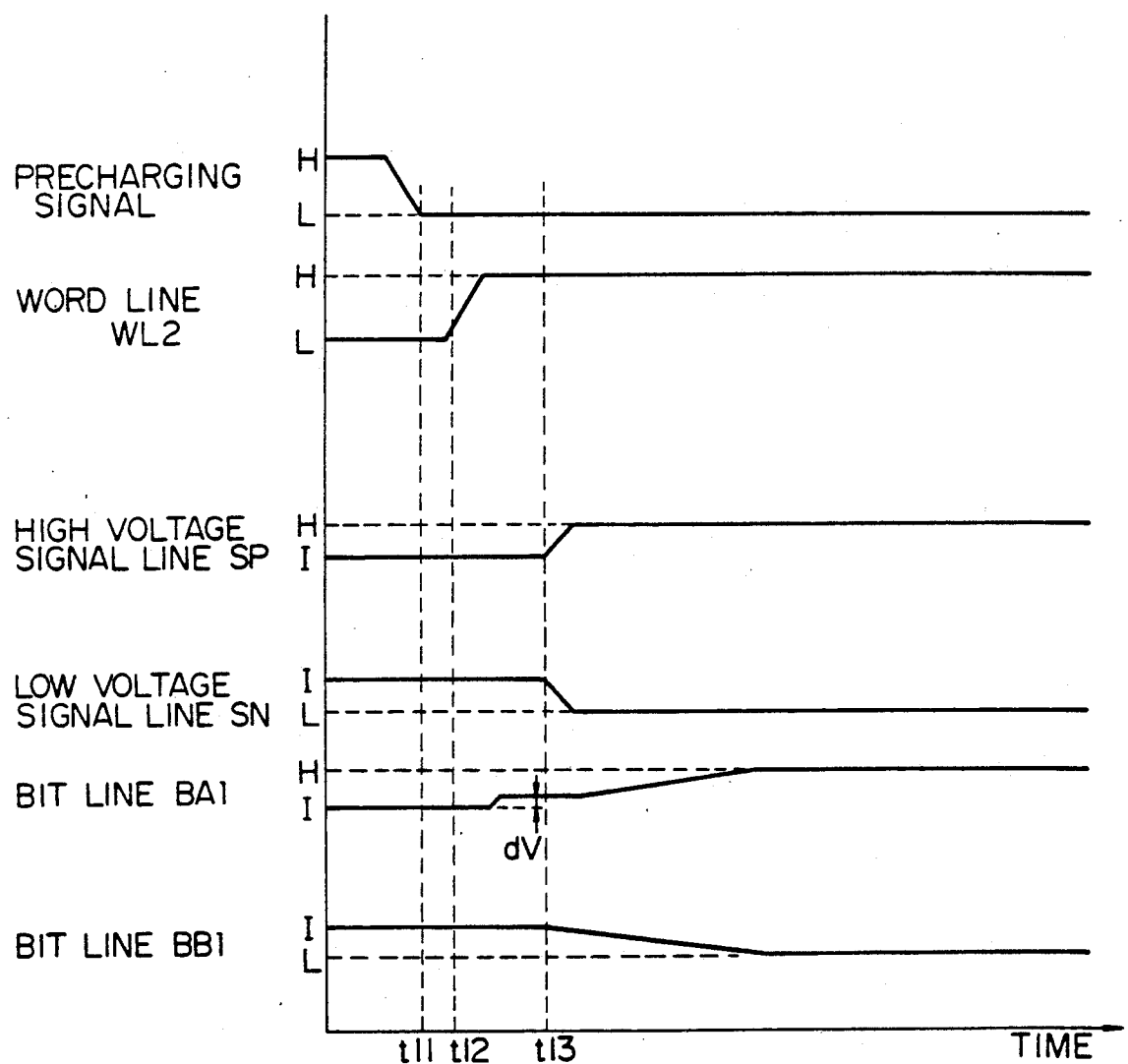
FIG. 2 is a diagram showing the waveforms of essential signals produced in the prior art semiconductor memory device shown in FIG. 1.
Figure 3:
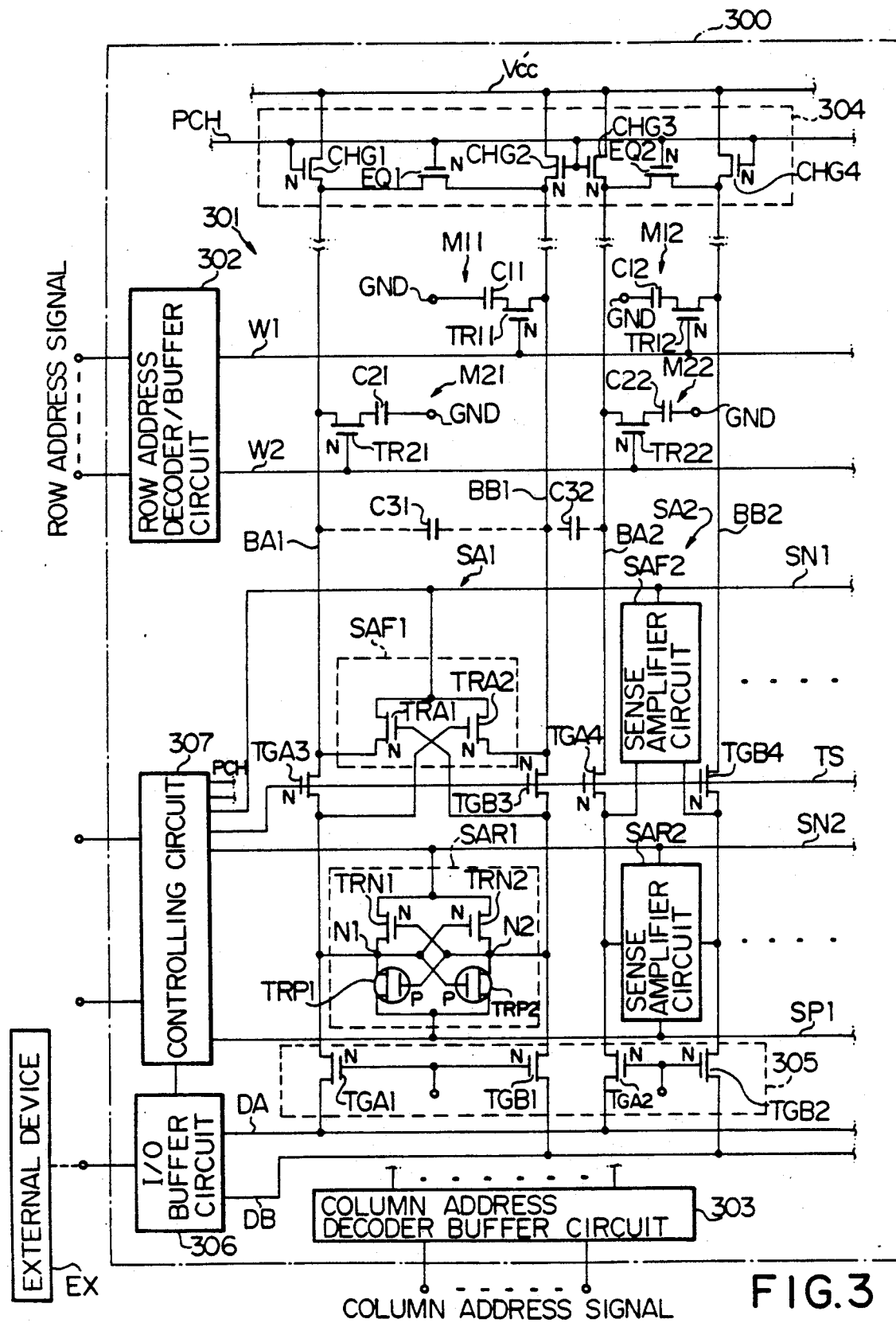
FIG. 3 is a circuit diagram showing the arrangement of a semiconductor memory device embodying the present invention.
Figure 4:
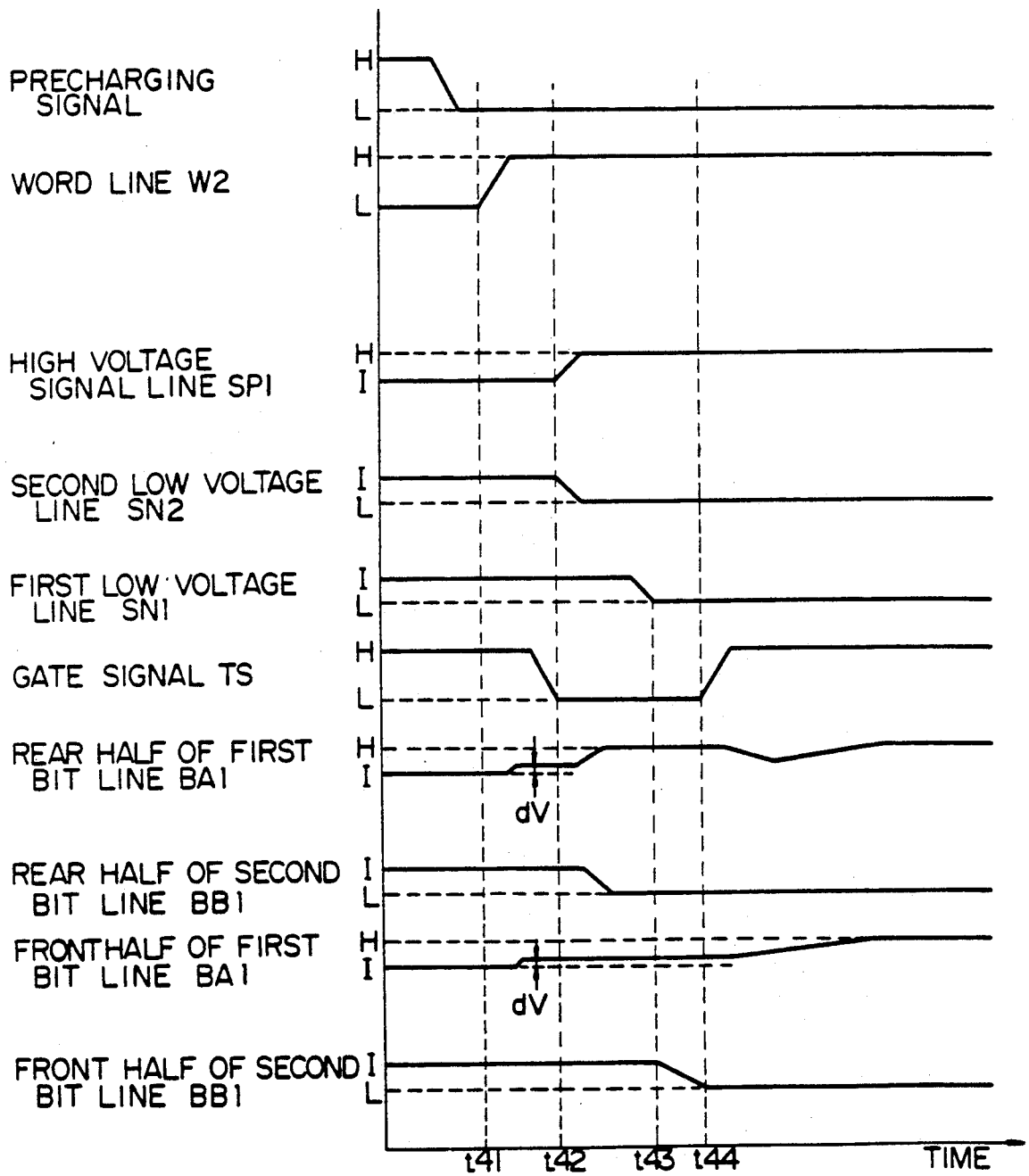
FIG. 4 is a diagram showing the waveforms of essential signals produced in the semiconductor memory device shown in FIG. 4.

Referring first to FIG. 3 of the drawings, a semiconductor memory device according to the present invention is fabricated on a semiconductor substrate 300. The semiconductor memory device shown in FIG. 3 largely comprises a memory cell array 301, a row address decoder and buffer circuit 302, a column address decoder and buffer circuit 303, a precharging circuit 304, a column selector circuit 305, a data input and output buffer circuit 306, a controlling circuit 307 and a plurality of tandem sense amplifier units SA1 and SA2. Although the memory cell array 301 has a large number of memory cells, only four memory cells M11, M12, M21 and M22 are shown in FIG. 3 for the sake of simplicity.

The memory cells M11, M12, M21 and M22 have respective gate transistors TR11, TR12, TR21 and TR22 and respective storage capacitors C11, C12, C21 and C22 coupled in series to the gate transistors, respectively. The storage capacitors C11 to C22 are coupled to a ground node GND, and memorize data bits in the form of electric charges depending upon the logic levels thereof.

The semiconductor memory device further comprises a plurality of first bit lines BA1 and BA2 and a plurality of second bit lines BB1 and BB2, and the first bit lines BA1 and BA2 alternate the second bit lines BB1 and BB2. Each of the first bit lines is coupled to every second column of the memory cells, and the second bit lines are respectively coupled to the other columns of the memory cells. In FIG. 3, the first bit lines BA1 and BA2 are coupled to the gate transistors TR21 and TR22 of the memory cells M21 and M22, respectively, and the second bit lines BB1 and BB2 are coupled to the gate transistors TR11 and TR12 of the memory cells M11 and M12, respectively. The first bit lines BA1 and BA2 are respectively paired with the second bit lines BB1 and BB2 so that a plurality of bit line pairs are formed.

The rows of the memory cells M11 to M22 are further associated with word lines W1 and W2, and the gate electrodes of the gate transistors TR11 to TR22 are coupled to the word lines W1 and W2. The row address decoder and buffer circuit 302 is responsive to a row address signal, and allows one of the word lines W1 and W2 to go up from a low voltage level to a high voltage level so that the gate transistors coupled thereto concurrently turn on to provide conduction paths between the storage capacitors and the associated bit lines. When the gate transistors turn on, the data bits are read out from the storage capacitors to the first bit lines BA1 and BA2 or the second bit lines BB1 and BB2 in the form of small differences in voltage level.

The precharging circuit 304 has charge transistors CHG 1, CHG2, CHG3 and CHG4 coupled between a source of voltage level Vcc' and the first and second bit lines BA1, BA2, BB1 and BB2, and the first bit lines BA1 and BA2 are further coupled to the second bit lines paired therewith through equalizing transistors EQ1 and EQ2, respectively. All of the charging transistors CHG1 to CHG4 and the equalizing transistors EQ1 and EQ2 are gated by a precharging line PCH, and all of the first and second bit lines BA1, BA2, BB1 and BB2 are exactly charged up to an intermediate voltage level between the high and low voltage levels.

Although the precharging circuit 304 has the charge transistors CHG1 to CHG4, these charge transistors may be omitted from the precharging circuit. In this implementation, the equalizing transistors EQ1 and EQ2 turn on to provide the respective conduction paths between the first bit lines BA1 and BA2 and the second bit lines BB1 and BB2 after the sensing operation. When the sensing operation is completed, one of the first and second bit lines goes up to the positive high voltage level Vcc, and the other bit lines go down to the ground level, so that both of the first and second bit lines are automatically adjusted to the intermediate voltage level ½ Vcc through the equalizing transistors EQ1 and EQ2.

The column selector circuit 305 comprises first gate transistors TGA1 and TGA2 respectively coupled to the first bit lines BA1 and BA2 and second gate transistors TGB1 and TGB2 respectively coupled to the second bit lines BB1 and BB2, and the first gate transistors TGA1 and TGA2 are paired with the second gate transistors TGB1 and TGB2 for formation of gate transistor pairs. The column address decoder and buffer circuit 303 is responsive to a column address signal, and allows one of the gate transistor pairs to be transparent so that a large difference in the voltage level between the bit line pair is transferred to the data input and output buffer circuit 306 through data lines DA and DB.

The tandem sense amplifier unit SA1 and SA2 have respective third gate transistors TGA3 and TGA4 paired with fourth gate transistors TGB3 and TGB4 for forming gate transistor pairs. The third pair of gate transistors TGA3 and TGA4 are inserted into the first bit lines BA1 and BA2, and the first bit lines BA1 and BA2 are shared into front and rear halves, respectively. Similarly, the fourth pair of gate transistors TGB3 and TGB4 are inserted into the second bit lines BB1 and BB2, so that the second bit lines BB1 and BB2 are also shared into front and rear halves, respectively. All of the gate transistors TGA3, TGA4, TGB3 and TGB4 are gated by a transfer signal line TS, and the front halves are electrically connected to or isolated from the rear halves depending upon the transfer signal. The tandem sense amplifier units SA1 and SA2 further have first sense amplifier circuits SAF1 and SAF2 each coupled to the front halves of the first and second bit lines, and second sense amplifier circuits SAR1 and SAR2 each coupled to the rear halves of the first and second bit lines. Thus, each of the bit line pairs is associated with two sense amplifier circuits for improving the operation speed.

The first sense amplifier circuits SAF1 and SAF2 are similar in arrangement to one another, and the second sense amplifier circuits SAR1 and SAR2 are also arranged into a predetermined layout, so that description is made for the sense amplifier circuit SAF1 and SAR1, respectively. The first sense amplifier circuit SAF1 is formed by two amplifying transistors TRA1 and TRA2, and the two amplifying transistors TRA1 and TRA2 are coupled in parallel between a first low voltage line and the rear halves of the first and second bit lines BA1 and BB1. The amplifying transistors TRA1 and TRA2 are gated by the rear halves of the bit lines BB1 and BA1 in a cross coupled manner, so that the first sense amplifier circuit SAF1 increases the small difference in the voltage level between the front halves of the bit lines BA1 and BB1 depending upon the small difference between the rear halves of the bit lines BA1 and BB1. On the other hand, the second amplifier circuit SAR1 comprises two complementary inverter circuits having two n-channel type field effect transistors TRN1 and TRN2 and p-channel type field effect transistors TRP1 and TRP2, and the complementary inverter circuits are coupled in parallel between a second low voltage line SN2 and a high voltage line SP1. Two sensing nodes N1 and N2 are provided between the n-channel type field effect transistors TRN1 and TRN2 and the p-channel type field effect transistors TRP1 and TRP2, respectively, and are connected to not only the rear halves of the bit lines BA1 and BB1 but also the gate electrodes of the opposite complementary inverter circuits. The second amplifier circuit SAR1 thus arranged increases the small difference in voltage level between the rear halves of the bit lines BA1 and BB1, and a large difference in voltage level takes place on the rear halves per se.

C31 and C32 are indicative of parasitic capacitances between the fist and second bit lines BA1 and BB1 and between the second and first bit lines BB1 and BA2, respectively.

Description is made for a reading out operation from the memory cell M21 on the assumption that the memory cell M21 memorizes a data bit of logic "1" corresponding to the high voltage level.

First, the precharging signal line PCG goes up to the high voltage level so that all of the first and second bit lines BA1, BA2, BB1 and BB2 are charged up to the intermediate voltage level. Since the transfer signal TS remains in the high voltage level, not only the front halves but also the rear halves go up to the intermediate voltage level. However, the high and low voltage lines SP1, SN1 SN2 remain in the intermediate level, and the sense amplifier units SA1 and SA2 are not activated yet.

When the precharging signal line PCG is recovered to the low voltage level, the first and second bit lines BA1, BA2, BB1 and BB2 are separated from the source of positive voltage level Vcc'. If the row address decoder and buffer circuit 302 allows the word line W2 to go up to the high voltage level at time t41, the gate transistors TR21 and TR22 turn on to provide the conduction paths between the storage capacitors C21 and C22 and the first bit lines BA1 and BA2, respectively, and the first bit line BA1 slightly goes up toward the high voltage level. This results in that a small difference in voltage level dV takes place between the first and second bit lines BA1 and BB1. The gate transistors TGA3 and TGB3 propagate the small difference dV to the rear halves of the first and second bit lines BA1 and BB1.

If the small difference dV is produced over the first and second bit lines BA1 and BB1, the gate signal TS goes down to the low voltage level, and, accordingly, all of the gate transistors TGA3, TGB3, TGA4 and TGB4 turn off to cut off the first and second bit lines, respectively. If the high voltage signal line SP1 goes up to the high voltage level and, accordingly, the second low voltage signal line SN2 goes down to the low voltage level at time t42, the second sense amplifier circuit SAR1 is activated so that the small difference in voltage level dV is increased to produce a large difference in voltage level. Since the rear halves of the first and second bit lines BA1 and BB1 are electrically separated from the front halves thereof, most of the parasitic capacitance C31 is not coupled to the sense node N1 and N2, and, for this reason, the sensing operation consumes a relatively small amount of time. This results in improvement in operation speed. Furthermore, the sense node N2 is free from the capacitive unbalance due to the parasitic capacitance C32, so that any error is hardly made in the sensing operation. The column address decoder and buffer circuit 303 allows the gate transistors TGA1 and TGB1 to turn on, then the column selector circuit 305 becomes transparent to the large difference between the rear halves of the first and second bit lines BA1 and BB1. The data lines DA and DB propagate the large difference in voltage level to the data input and output buffer circuit 306, and, finally, a data bit of logic "1" level is read out to an external device EX.

At time t43, the first low voltage signal line SN1 goes down to the low voltage level, and the first sense amplifier circuit SAF1 is activated to discharge the front half of the second bit line BB1. If the gate signal TS goes up to the high voltage level at time t44 again, all of the gate transistors TGA3, TGB3, TGA4 and TGB4 turn on so that the transfer gates TGA3 and TGB propagate the large difference in voltage level between the rear halves to the front halves. The second sense amplifier circuit SAR1 further increases the difference between the front halves of the first and second bit lines BA1 and BB1, and the large difference between the front halves causes the memory cell M21 to refresh the data bit of logic "1".

Thus, the tandem sense amplifier unit SA1 according to the present invention not only achieves the high speed reading out operation, but also improves a stability of the data bit refreshed after the reading out operation. This is because of the fact that the first sense amplifier circuit SAF1 previously causes one of the first and second bit lines BA1 and BB1 to go down to the low voltage level. This previous operation keeps the voltage level at the p-channel type field effect transistor TRP1 constant, and is contusive to a smooth ascent of voltage level on the front half of the fist bit line BA1.

Although particular embodiments of the present invention have been shown and described, it will be obvious to those skilled in the art that various changes and modifications may be made without departing from the spirit and scope of the present invention.

What is claimed is:

1. A semiconductor memory fabricated on a semiconductor substrate, comprising:
    a) a memory cell array having a plurality of memory cells arranged in rows and columns, said memory cells being used for storing data bits, respectively;

b) a plurality of first bit lines each coupled to every second column of said memory cells;

c) a plurality of second bit lines respectively coupled to the other columns of said memory cells and paired with said first bit lines for forming a plurality of bit lines pairs;

d) a plurality of row lines respectively coupled to the rows of said memory cells and allowing said data bits to be read out from said memory cells coupled thereto to said first bit lines or said second bit lines in the form of small differences in voltage level between the first and second bit lines, respectively;

e) a precharging circuit coupled to said bit line pairs;

f) a plurality of sense amplifier units respectively having sense node pairs and respectively provided in association with said bit line pairs for increasing said small differences in voltage level, each of said sense node pairs having first and second sense nodes;

g) a data input and output unit for communicating with an external device; and h) a column selector circuit coupled to said bit line pairs for interconnecting one of said bit line pairs and said data input and output unit, in which each of said sense amplifier units has a pair of gate transistors respectively inserted between said sense node pair and said associated first and second bit lines, a first sense amplifier circuit coupled to the associated first and second bit lines, and a second sense amplifier circuit coupled to the sense node pair thereof, and in which said first sense amplifier circuit has first and second field effect transistors coupled between a first signal line and said first and second bit lines, the gate electrodes of said first and second field effect transistors being coupled to the second and first sense nodes of said associated sense node pair, wherein said second amplifier circuit comprising first and second complementary inverter circuits coupled in parallel between a second and third signal lines, and in which the first and second sense node of said associated sense node pair are provided on the common drain nodes of said first and second complementary inverter circuits, respectively, wherein the gate electrodes of said first and second complementary inverter circuits are coupled to said second and first sense nodes, respectively.

2. A semiconductor memory device as set forth in claim 1, in which said gate transistors turn off after said small difference in voltage level takes place over one of said bit line pairs, and in which said gate transistors turn on after increasing said small difference in voltage level between said associated sense node pair.

3. A semiconductor memory device as set forth in claim 2, in which each of said memory cells is formed by a series combination of a gate transistor and a storage capacitor.

* * * * *

UNITED STATES PATENT AND TRADEMARK OFFICE
CERTIFICATE OF CORRECTION

PATENT NO. :  5,029,137
DATED      :  July 2, 1991
INVENTOR(S):  Katsuji HOSHI

It is certified that error appears in the above-identified patent and that said Letters Patent is hereby corrected as shown below:

Col. 5, line 9, delete "amplifYing" and insert --amplifying--;

Col. 6, line 39, after "TGB" insert --3--.

Signed and Sealed this

Tenth Day of November, 1992

Attest:

DOUGLAS B. COMER

*Attesting Officer*      *Acting Commissioner of Patents and Trademarks*